United States Patent
Smith et al.

(10) Patent No.: US 11,454,992 B1
(45) Date of Patent: Sep. 27, 2022

(54) FLEXURE GUIDANCE SYSTEM

(71) Applicant: META PLATFORMS TECHNOLOGIES, LLC, Menlo Park, CA (US)

(72) Inventors: Clinton Smith, Redmond, WA (US); Ryan Michael Ebert, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 153 days.

(21) Appl. No.: 16/422,764

(22) Filed: May 24, 2019

(51) Int. Cl.
| | |
|---|---|
| *G05D 3/12* | (2006.01) |
| *G02B 27/00* | (2006.01) |
| *G02B 7/10* | (2021.01) |
| *B81B 3/00* | (2006.01) |
| *F16D 3/52* | (2006.01) |
| *B81B 5/00* | (2006.01) |
| *F16F 1/18* | (2006.01) |
| *F16F 1/22* | (2006.01) |
| *G05B 15/02* | (2006.01) |

(52) U.S. Cl.
CPC ............ *G05D 3/12* (2013.01); *B81B 3/0018* (2013.01); *B81B 3/0051* (2013.01); *B81B 5/00* (2013.01); *F16D 3/52* (2013.01); *F16F 1/18* (2013.01); *F16F 1/22* (2013.01); *G02B 7/10* (2013.01); *G02B 27/0068* (2013.01); *B81B 2203/051* (2013.01); *B81B 2207/053* (2013.01); *G05B 15/02* (2013.01)

(58) Field of Classification Search
CPC ...... G05D 3/12; F16F 1/22; F16F 1/18; F16D 3/52; B81B 5/00; B81B 3/0018; B81B 3/0051; B81B 2203/051; B81B 2207/053; G02B 27/0068; G02B 7/10; G05B 15/02
See application file for complete search history.

(56) References Cited

U.S. PATENT DOCUMENTS

| | | | | |
|---|---|---|---|---|
| 6,812,617 | B2* | 11/2004 | Ives | B81B 3/0021 310/309 |
| 9,370,865 | B1* | 6/2016 | Vangal-Ramamurthy | B25J 17/0208 |
| 10,295,028 | B2* | 5/2019 | Warriner | F16H 21/04 |
| 2004/0160585 | A1* | 8/2004 | Jacobs | G03F 7/709 355/53 |

* cited by examiner

*Primary Examiner* — Victor L Macarthur
(74) *Attorney, Agent, or Firm* — Fenwick & West LLP

(57) ABSTRACT

A flexure based guidance system for precision motion control includes a base that is fixed in position, a carriage that can move relative to the base, an actuator provides the force to move the carriage relative to the base, and one or more flexures arrays that each comprise two or more leaf flexure elements. The actuator causes the carriage to move relative to the base, which causes the flexure elements in the flexure array to flex. The leaf flexure elements are thin, compliant and deform, bend, or deflect in a deterministic manner when mechanically stressed. In some embodiments, stiffeners can be added to the flexures. The guidance system can be integrated into a varifocal head mounted display (HMD) to adjust a location of one or moveable elements in an optical system of the HMD to control a location of an image plane.

8 Claims, 9 Drawing Sheets

FLEXURE GUIDANCE SYSTEM

BACKGROUND

This disclosure relates generally to guidance systems, and in particular to flexure based guidance systems for precision motion control.

To achieve high quality, precise motion, typical flexure based linear stages rely on single or compound flexures located at each corner of the linear stage. The quality of motion (i.e., straightness, angular errors, etc.) is largely a function of the off-axis stiffness (e.g., torsional and axial stiffness of the flexures). This is achieved typically by using shorter (e.g., ~4 mm or more in length), thicker flexures (e.g., ~0060" to 0.0100" thick) at the cost of on-axis stiffness (bending stiffness) of flexures. Thus, conventional linear stages have often required a high actuator force, such as a piezoelectric actuator, to move the stage or are limited in range of travel.

SUMMARY

A flexure based linear stage guidance system for precision motion control is disclosed. The stage includes a base that is fixed in position, a carriage that is capable of moving relative to the base, one or more flexure arrays comprised of three or more leaf flexure or leaf hinge flexure elements, a power generation element to provide force to deflect the flexures along their compliant axis, and in some embodiments, a sensor or sensors to provide feedback on the position, velocity, and/or acceleration of the carriage relative to the base for closed-loop control and calibration. In one embodiment, the flexure elements are nominally redundantly constrained where the deflection of each individual flexure in the array or each array grouping does not induce significant stress in other flexure elements in the array, other flexure array groupings, the base, and/or the carriage. The leaf flexure elements are thin and compliant in one linear direction while stiff in all other degrees of freedom; thus, when mechanically stressed, the flexure elements deform, bend, or deflect in a deterministic manner in one degree of freedom creating high quality repeatable motion with minimal parasitic straightness and angular error.

In one embodiment, the flexure elements range from 0.0050" to 0.0005" thick in an array of 3 or more elements per grouping. In a typical flexure stage with only 1 flexure per group, flexure thicknesses this thin are too flimsy and impractical to provide precision motion. Reducing thickness reduces on-axis stiffness (proportional to thickness to the $3^{rd}$ power), reduces stress (proportional to thickness to the $2^{nd}$ power), and decreases off-axis linear stiffness (linearly proportional, ignoring buckling) while increasing the number of flexure elements to create an array of flexure elements increases the on-axis stiffness (linearly proportional), has no effect on stress, and increases, the off-axis linear stiffness (linearly proportional). With the increased reduction in on-axis stiffness (i.e., due to reducing the thickness of the flexures compared to increasing the quantity), the number of flexure elements can be increased to add off-axis stiffness and, thereby, provide higher quality motion. Pairing an array of flexure elements with another, offset array of flexure elements allows linear stiffness to dominate and thus the rotational stiffness of individual flexure elements become largely insignificant. Accordingly, the leaf flexure/leaf hinge flexure elements are thin and compliant in one linear direction while stiff in all other degrees of freedom. Thus, when mechanically stressed, the leaf flexure/leaf hinge flexure elements deform, bend, or deflect in a deterministic manner in one degree of freedom creating high quality, repeatable motion with minimal parasitic straightness and angular error. The plurality of thin flexure elements allows for longer travels and higher payload capabilities within a small package size.

In some embodiments, stiffeners can be added to the flexures that concentrate the flexure deformation that effectively create leaf hinge flexures. Addition of the stiffeners increases rotational and buckling stiffness about areas of the flexures where the stiffener is not location, resulting in a slight increase in stress and on-axis stiffness. Thus, a flexure array guidance system can provide large displacements from 0.5 mm to more than 50 mm, in a much smaller package, with improved motion precision than tradition single flexures. Additionally, a flexure guidance system is friction-free compared to shaft in bushing guidance, can be implemented with fewer parts, and may be integrated to molded plastic parts.

To generate the force required to deflect the flexures and thus create motion, the stage linear stage may include a manual application, such as through an adjustment screw, lead-screw, micrometer, and so forth, or include a motor or actuator such as a voice coil actuator, stepper motor, brushless DC motor, piezoelectric actuator, and so forth. Moreover, the sensor element for closed-loop control and calibration can include a magnetic or optical encoder, a capacitive sensor, a laser displacement interferometry, and so forth.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Flexure Guidance Systems

Figure 1A:
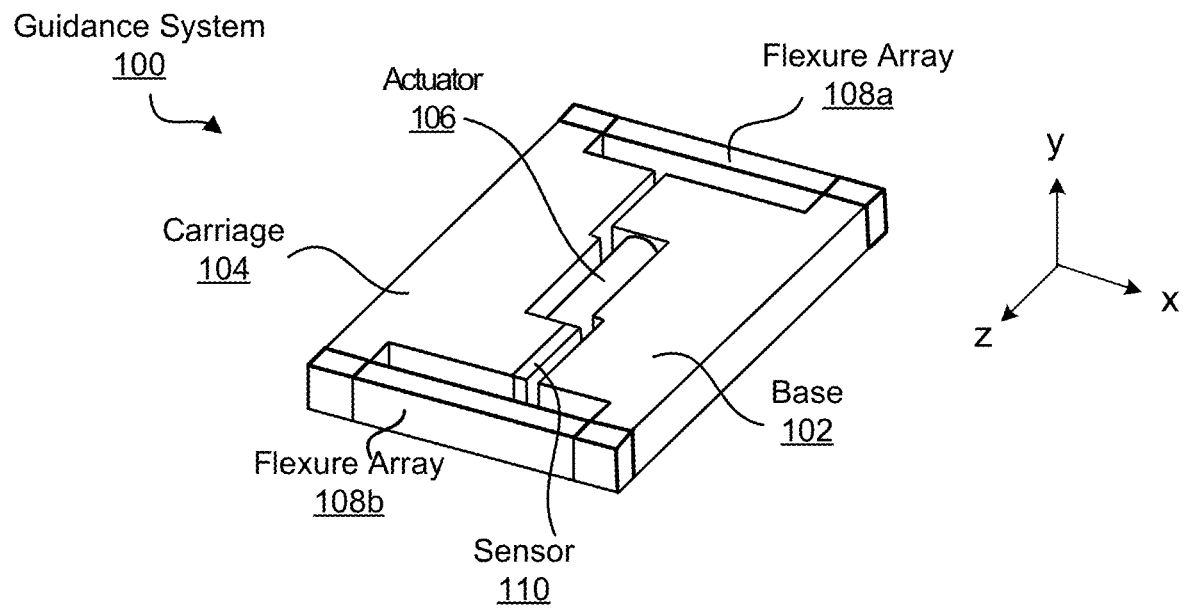
FIG. 1A shows a diagram of a linear stage flexure guidance system, in accordance with at least one embodiment.

FIG. 1A shows a diagram of a linear stage flexure guidance system 100, in accordance with at least one embodiment. The guidance system 100 includes a base 102 and a carriage 104 that is configured to move relative to the base 102. An actuator 106 provides power generation/transmission of force from the base 102 to the carriage 104 and moves the carriage relative to the base when in operation. A manual transmission of power such as an adjustment screw, lead-screw, micrometer, and so forth can be used in place of a motor or actuator 106. At least two sets of flexure arrays (first flexure array 108a and second flexure array 108b) connect the base 102 to the carriage 104 at each end of the linear stage guidance system 100. First flexure array 108a connects the carriage 104 to the base 102 at a first end of the carriage 104 and the base 102, and the second flexure array 108b connects the carriage 104 to the base 102 at a second end of the carriage 104 and the base 102. Accordingly, when the actuator 106 moves the carriage 104, the flexure arrays 108a and 108b (collectively, "flexure arrays 108") flex guiding movement of the carriage while minimizing parasitic off-axis error motion, as described above. A sensor 110 (or sensors) can be included to provide feedback on the position, velocity, and acceleration states of the carriage 104 relative to the base 102 for closed-loop control and calibration.

Figure 1B:
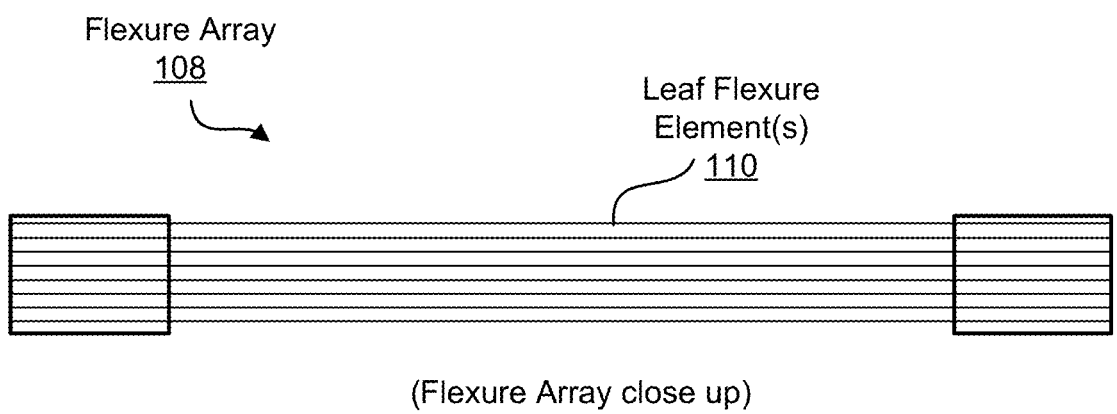
FIG. 1B shows a close-up diagram of a flexure array including a plurality of leaf flexure elements that can be used in a linear stage flexure guidance system, in accordance with at least one embodiment.

FIG. 1B shows a close-up diagram of a flexure array 108 (i.e., flexure array 108a or 108b) that includes a plurality of leaf flexure elements 110 that can be used in a linear stage flexure guidance system, in accordance with at least one embodiment. The flexure array 108 can include any number (e.g., ~2 to 20) of leaf flexure elements 110. The leaf flexure elements 110 can be made from a metal (e.g., Titanium, stainless steel, spring steel, Beryllium Copper, etc.) and/or plastic (e.g., DELRIN, Polypropylene, etc.). In contrast to conventional flexure based linear stages, each leaf flexure element 110 is between 0.005" and 0.0005" thick. An array of flexure elements with such thicknesses enable off-axis stiffness to be maintained as a result of the relatively high number of individual leaf flexure element 110, while on-axis stiffness decreases allowing for a lower force required by the actuator 106. In other embodiments, the length and thickness of the leaf flexure elements 110 can be tweaked to gain additional off-axis stiffness or allow for higher loads or longer travels. Moreover, the leaf flexure element 110 can be machined monolithic from a single material or individually assembled from a number of different pieces joined with fasteners, rivets, epoxy, brazing, welding, etc. Higher load application can use stiffeners machined or assembled to the middle portion of the leaf flexure element 110 to improve stiffness due to buckling and torsional loads. Flexures can have geometries including but not limited to leaf, circular, elliptical, etc.

Figure 1C:
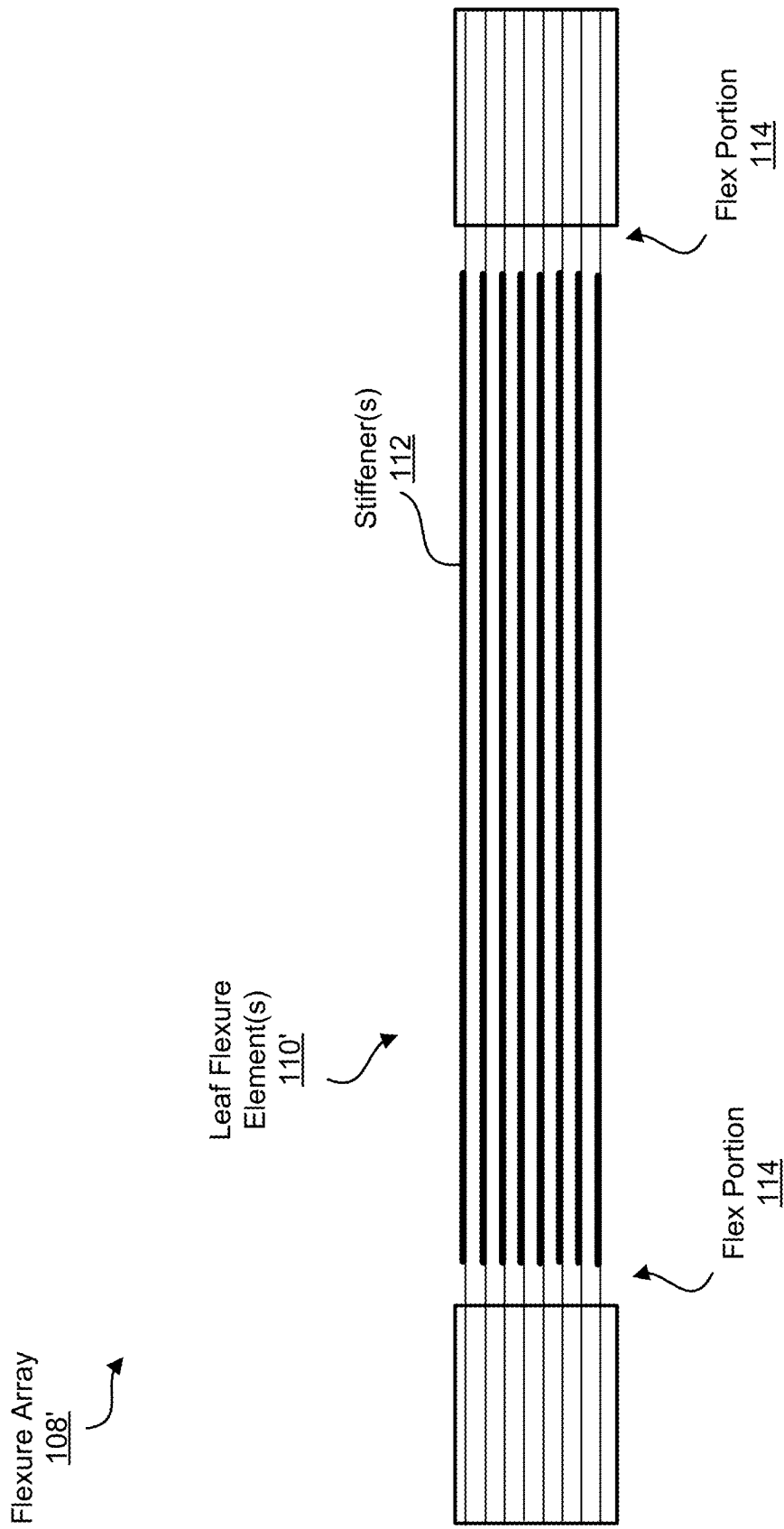
FIG. 1C shows a close-up diagram of a flexure array including a plurality of leaf hinge flexure elements with stiffeners, in accordance with at least one embodiment.

FIG. 1C shows a close-up diagram of a flexure array 108' that includes a stiffener 112 on each of the plurality of leaf flexure elements 110', in accordance with at least one embodiment. The stiffener(s) 112 are configured to reduce bending, buckling, and torsion in a middle portion of the flexure element 110' and instead focus the bend or flex at the end or flex portion 114. Thus, one or more or all of the leaf flexure elements can include a stiffener 708, depending on the desired flex or stiffness. In one embodiment, the stiffener 112 is an additional layer of material on a middle portion of a leaf flexure element 110'. This can be a thicker middle portion that has been integrated into the manufacture or fabrication of the leaf flexure element itself or the stiffener can be an additional piece applied after fabrication of the leaf flexure element. Accordingly, the stiffener 112 of each leaf flexure element focuses the flexing or bending of the leaf flexure element to each end or flex portion 114 of the leaf flexure element corresponding to an area along a length of the leaf flexure element other than where the stiffener is located. In some instances, the stiffener 112 eliminates all flex or bending of the leaf flexure element 110' where the stiffener 112 is located. In other instances, the stiffener 112 still bends/flexes, but is much less than it would be if the stiffener 112 were not present (i.e., the bend/flex characteristic of the leaf element 110' alone).

To approach pure linear motion while minimizing actuation requirements, in some embodiments, off-axis stiffness is maximized while the on-axis stiffness in the direction of motion is minimized. Off-axis stiffness of a leaf flexure element 110 is sensitive to the length L, and width b, of the flexures (inversely proportional to $L^3$ and proportional to $b^3$) and the spacing between them. On-axis stiffness is sensitive to the thickness t, and length of each leaf flexure element 110 (proportional to $t^3$ and inversely proportional to $L^3$). By reducing the thickness of individual leaf flexure element 110 and increasing the quantity of the leaf flexure elements 110 (from 2 to quantity n) to produce the flexure array 108, the structural sensitivities are exploited to reduce on-axis stiffness (on-axis stiffness is proportional to number of flexures, n) with lesser effects on off-axis stiffness. Alternatively, the quantity of leaf flexure elements 110 can be increased such that on-axis stiffness is maintained and off-axis stiffness is increased.

Figure 2A:
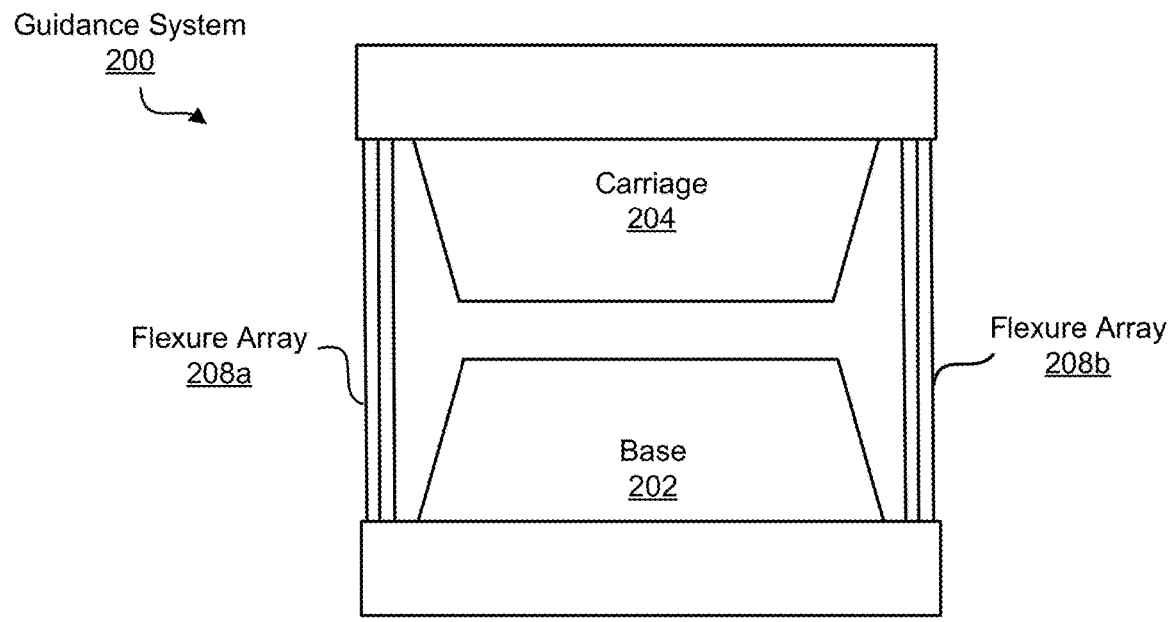
FIG. 2A shows another diagram of a linear stage flexure guidance system in a first position, in accordance with at least one embodiment.

FIG. 2A shows an example linear stage flexure guidance system 200 in a first position, in accordance with at least one embodiment. The guidance system 200 includes a base 202 and a carriage 204 that is configured to move relative to the base 202. As above, an actuator (not shown) provides power generation/transmission of force from the base 202 to the carriage 204 and moves the carriage relative to the base when operated. As above, a manual transmission of power such as an adjustment screw, lead-screw, micrometer, and so forth can be used in place of a motor or actuator (not shown). At least two sets of flexure arrays (first flexure array 208a and second flexure array 208b), as discussed with respect to FIG. 1B, connect the base 202 to the carriage 204 at each end of the linear stage guidance system 200. FIG. 2A shows the guidance system 200 at rest or in a first position where the flexure arrays are in an unflexed state. A sensor or sensors (not shown) can be included to provide feedback on the position, velocity, and acceleration states of the carriage relative to the base for closed-loop control and calibration.

Figure 2B:
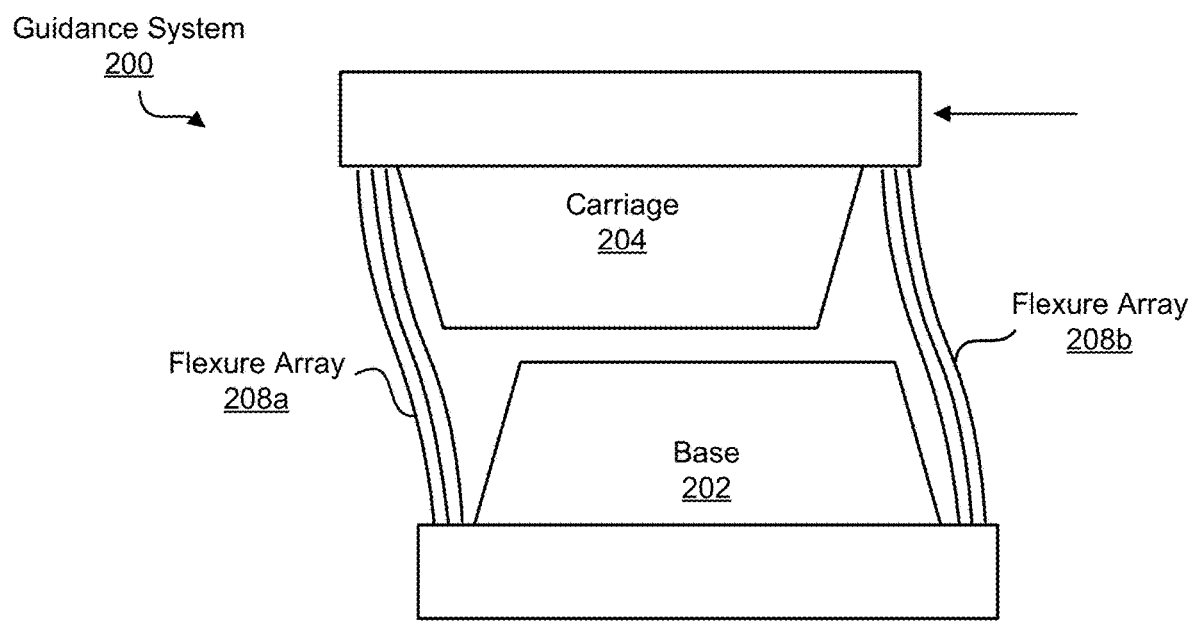
FIG. 2B shows a diagram of the linear stage flexure guidance system of FIG. 2A in a second position, in accordance with at least one embodiment.

FIG. 2B shows the linear stage flexure guidance system 200 of FIG. 2A in a second position or with the flexure arrays in a flexed state, in accordance with at least one embodiment. Accordingly, in this example, the actuator has moved the carriage 204 relative to the base 202 causing the flexure arrays 208a and 208b to flex, thereby, guiding movement of the carriage 204 while minimizing off-axis motion, as described above.

Figure 2C:
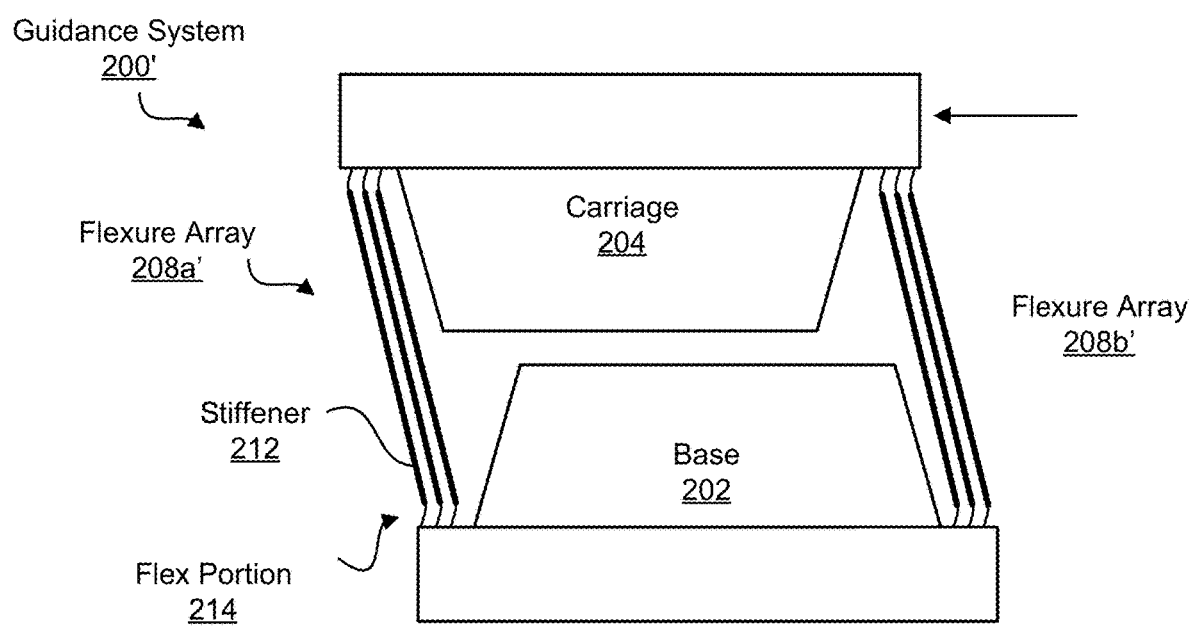
FIG. 2C shows a diagram of the linear stage flexure guidance system of FIG. 2A in a second position corresponding to FIG. 2B with stiffeners on the leaf hinge flexures, in accordance with at least one embodiment.

FIG. 2C shows a linear stage flexure guidance system 200' of FIG. 2A that includes a stiffener 212 on each of the plurality of leaf flexure elements in a flexed state, in accordance with at least one embodiment. Accordingly, in this example, the actuator has moved the carriage 204 relative to the base 202 causing the flexure arrays 208a and 208b to flex about flex portion 214 due to the stiffeners 212, as described above with respect to FIG. 1C.

Figure 3:
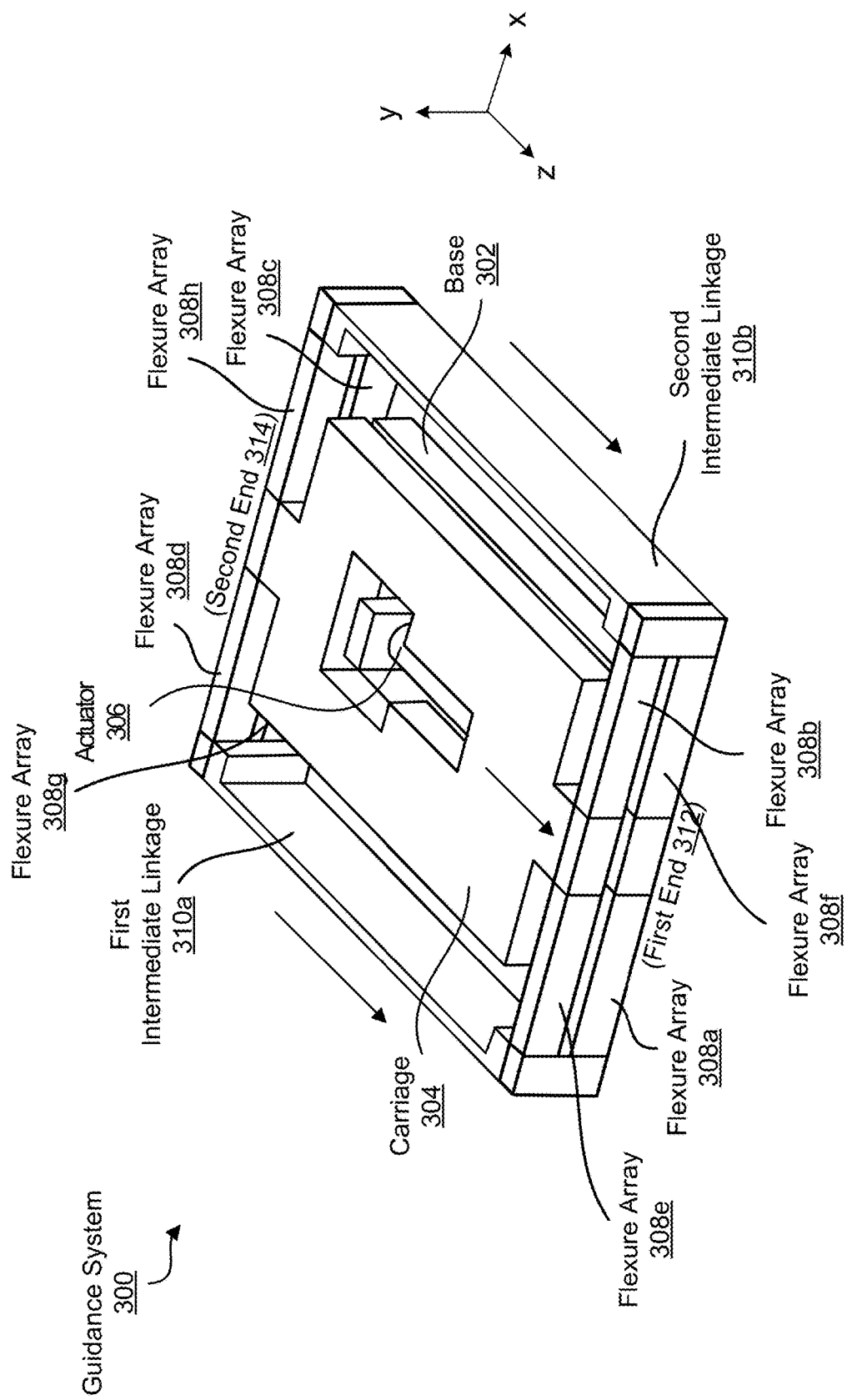
FIG. 3 shows another diagram of a linear stage flexure guidance system, in accordance with at least one embodiment.

FIG. 3 shows another diagram of a linear stage flexure guidance system 300, in accordance with at least one embodiment. The guidance system 300 includes a base 302 and a carriage 304 that is configured to move relative to the base 302. An actuator 306 provides power generation/transmission of force from the base 302 to the carriage 304 and moves the carriage 304 relative to the base 302 when in operation along an axis of motion (i.e., z-axis). The base 302 and carriage 304 have a first end 312 and a second end 314 relative to the axis of motion. In this embodiment, flexure guidance system 300 includes eight flexure arrays (308a, 308b, 308c, 308d, 308e, 308f, 308g, 308h), as discussed with respect to FIG. 1B, and a first intermediate linkage 310a and a second intermediate linkage 310b that travel half the distance of the carriage 304 and provide additional off-axis rotational stiffness. The first intermediate linkage 310a is positioned on a first side of the base 302 and carriage 304 and the second intermediate linkage 310b is positioned on a second or opposite side. Each of the eight flexure arrays are paired with another flexure array. The coupled "arc" motion of the 2 coupled flexure arrays offset one another and eliminate the parasitic "arc" motion creating linear motion at the carriage 304.

Accordingly, at the first end 312, flexure array 308a connects the base 302 to the first intermediate linkage 310a and flexure array 308e connects the carriage 304 to the first intermediate linkage 310a. Similarly, at the first end 312, flexure array 308b connects the carriage 304 to the second intermediate linkage 310b and the flexure array 308f connects the base 302 to the second intermediate linkage 310b. At the second end 314, flexure array 308c connects the base 302 to the second intermediate linkage 310b and the flexure array 308h connects the carriage 304 to the second intermediate linkage 310b. Similarly, at the second end 314, flexure array 308d connects the carriage 304 to the first intermediate linkage 310a and the flexure array 308g connects the base 302 to the second intermediate linkage 310b.

Accordingly, when the actuator 306 moves the carriage 304 relative to the base 302, the eight flexure arrays (308a, 308b, 308c, 308d, 308e, 308f, 308g, 308h) flex and guide movement of the carriage 304 while minimizing off-axis motion. Thus, in operation, the base 302 is fixed in position and the carriage 304 moves along the axis of motion (i.e., z-axis). This causes the first and second intermediate linkages (310a and 310b) to also move along the axis of motion, but at only approximately half the distance of the carriage 304. The result is that the second flexure array 308b and the fourth flexure array 308d, which are connected to the carriage 304, flex or bend outward in a substantially convex manner while the first flexure array 308a and the third flexure array 308c, which are connected to the base 302 flex inward in a substantially concave manner. The above flex pattern of the flexure arrays is described as "substantially convex" or "substantially concave" because the characteristic flex pattern resembles more of an "S" shape. In some instances, the "S" shape flex pattern is half convex and half concave. In either instance, the flex pattern is, thus, an "S" shape that is either substantially convex or substantially concave. Due to the first and second intermediate linkages 310 and number of flexure arrays 308, in this embodiment, the flex required or imposed on the flexure arrays 308 is approximately half the flex required or imposed on the flexure arrays 108 and 208 described above with respect to FIGS. 1 and 2A-2B.

Figure 4A:
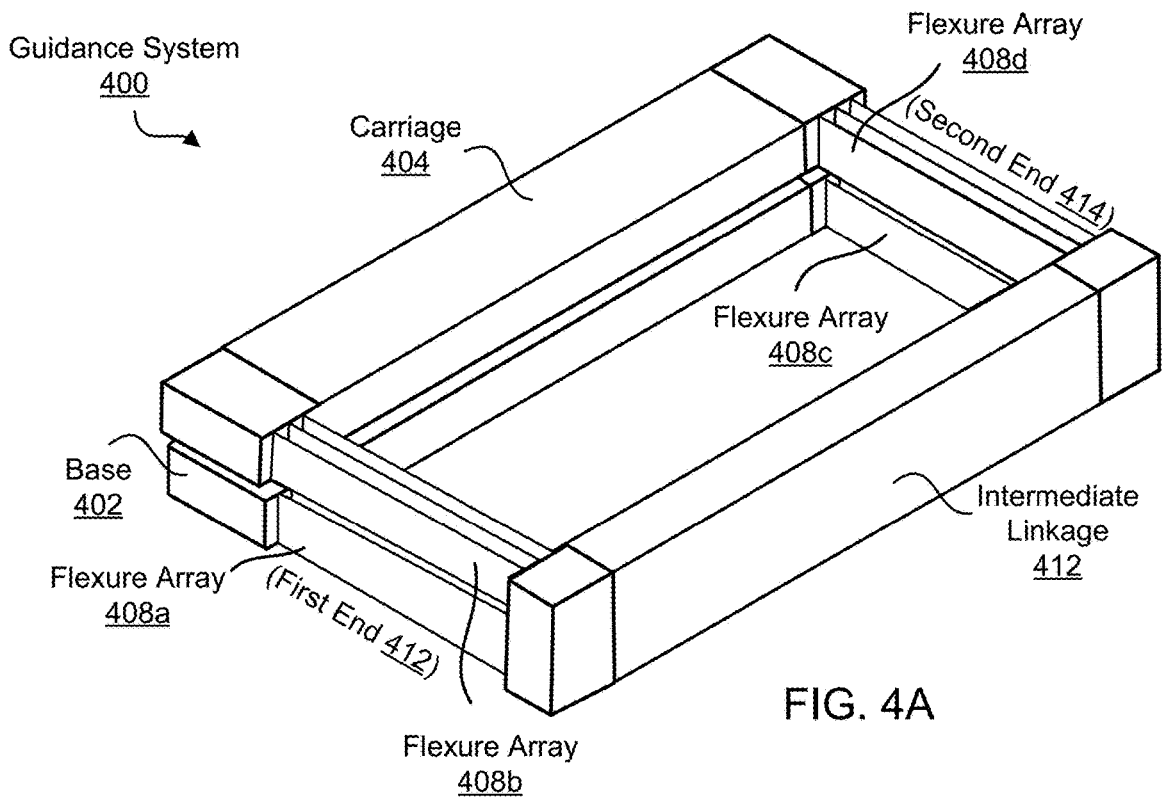
FIG. 4A shows another diagram of a linear stage flexure guidance system in a first position, in accordance with at least one embodiment.

FIG. 4A shows another diagram of a linear stage flexure guidance system 400 in a first position, in accordance with at least one embodiment. The guidance system 400 includes a base 402 and a carriage 404 that is configured to move relative to the base 402. As above, an actuator (not shown) causes the base 402 to move the carriage 404 when operated. In this embodiment, flexure guidance system 400 includes four flexure arrays (408a, 408b, 408c, 408b and an intermediate linkage 412 positioned offset relative to the base 402 and carriage 404. Flexure guidance system 400 is essentially flexure guidance system 300 split in half with only a single intermediate linkage 412 instead of two. The flexure arrays include a first flexure array 408a at the first end 414 that connects the base 402 to the intermediate linkage 412; a second flexure array 408b at the first end 414 connects the carriage 304 to the intermediate linkage 412; a third flexure array 408c at the second end 414 connects the base 402 to the intermediate linkage 412; and a fourth flexure array 408d at the second end 414 connects the carriage 404 to the intermediate linkage 412. Thus, in operation when the actuator moves the carriage 404 relative to the base 402, the four flexure arrays (408a, 408b, 408c, 408b) flex and guide movement of the carriage 404 while minimizing off-axis motion. FIG. 4A shows the guidance system 400 at rest or in a first position where the flexure arrays are in an unflexed state.

Figure 4B:
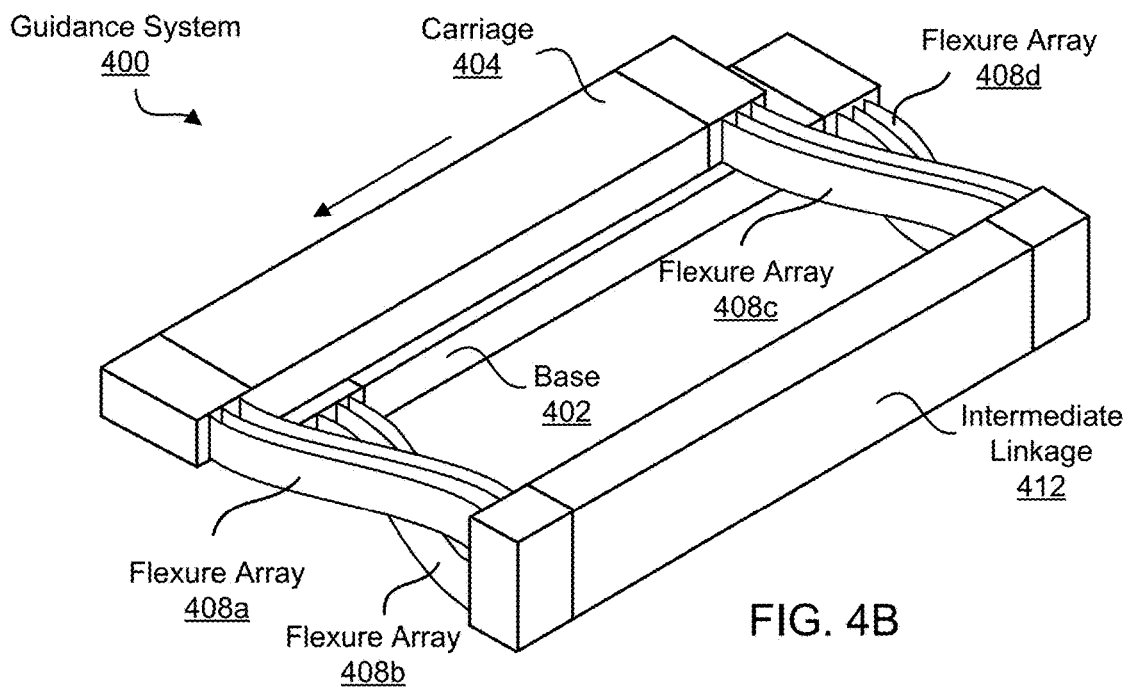
FIG. 4B shows a diagram of the linear stage flexure guidance system of FIG. 4A in a second position, in accordance with at least one embodiment.

FIG. 4B shows a diagram of the linear stage flexure guidance system 400 of FIG. 4A in a second position, in accordance with at least one embodiment. Accordingly, in this example, the actuator has moved the carriage 404 relative to the base 402 causing the four flexure arrays (408a, 408b, 408c, 408b) to flex, thereby, guiding movement of the carriage 404 while minimizing off-axis motion, as described above.

Figure 5A:
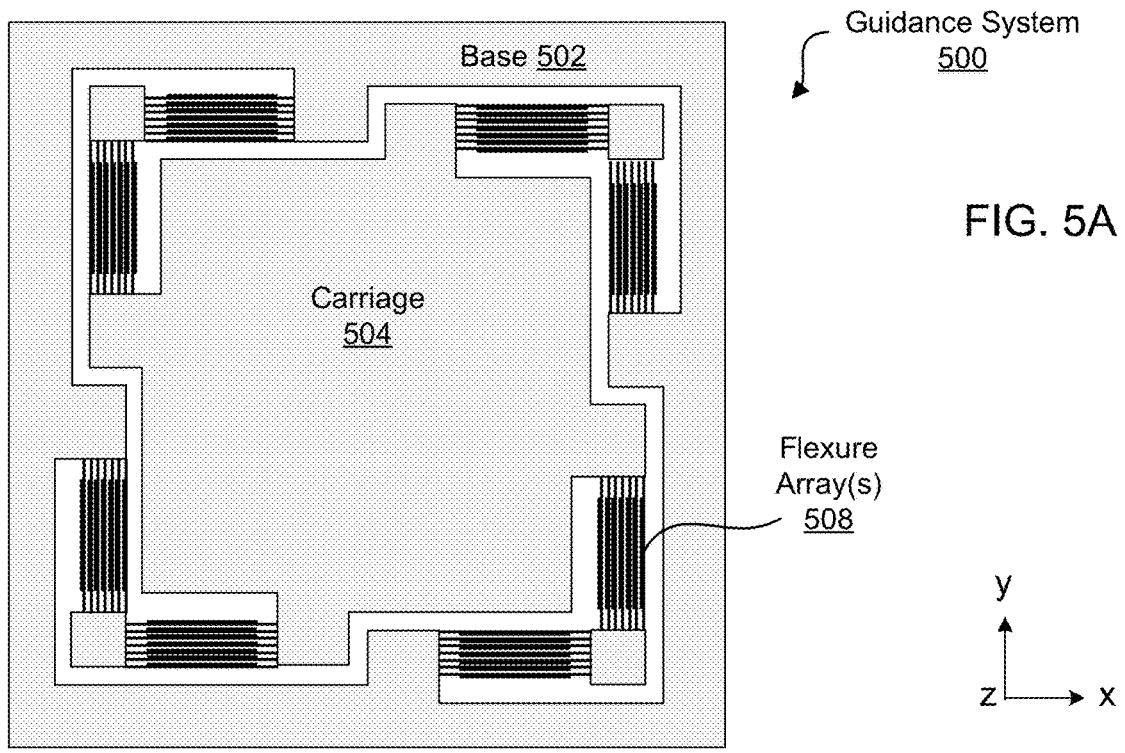
FIG. 5A shows a diagram of an XY stage in a first position with X and Y leaf hinge flexure arrays configured to operate in tandem, in accordance with at least one embodiment.

FIG. 5A shows a diagram of an XY stage guidance system 500, in accordance with at least one embodiment. The XY stage guidance system includes a base 502, a carriage 504, flexure arrays 508 connecting the base 502 and carriage 504, a power generating/force transmission element, such as an actuator, motor, as discussed above (not shown), and, in some embodiments, a position sensor. Moreover, in this embodiment, flexure arrays 508 include stiffeners, as discussed with respect to FIGS. 1C and 2C. FIG. 5A shows XY stage guidance system 500 in a first position with X and Y leaf hinge flexure arrays 508 configured to operate in tandem. While FIG. 5A shows the outer ring as base 502 and the inner piece as the carriage 504, the outer ring can be the carriage and the inner piece the base in alternative embodiments.

Figure 5B:
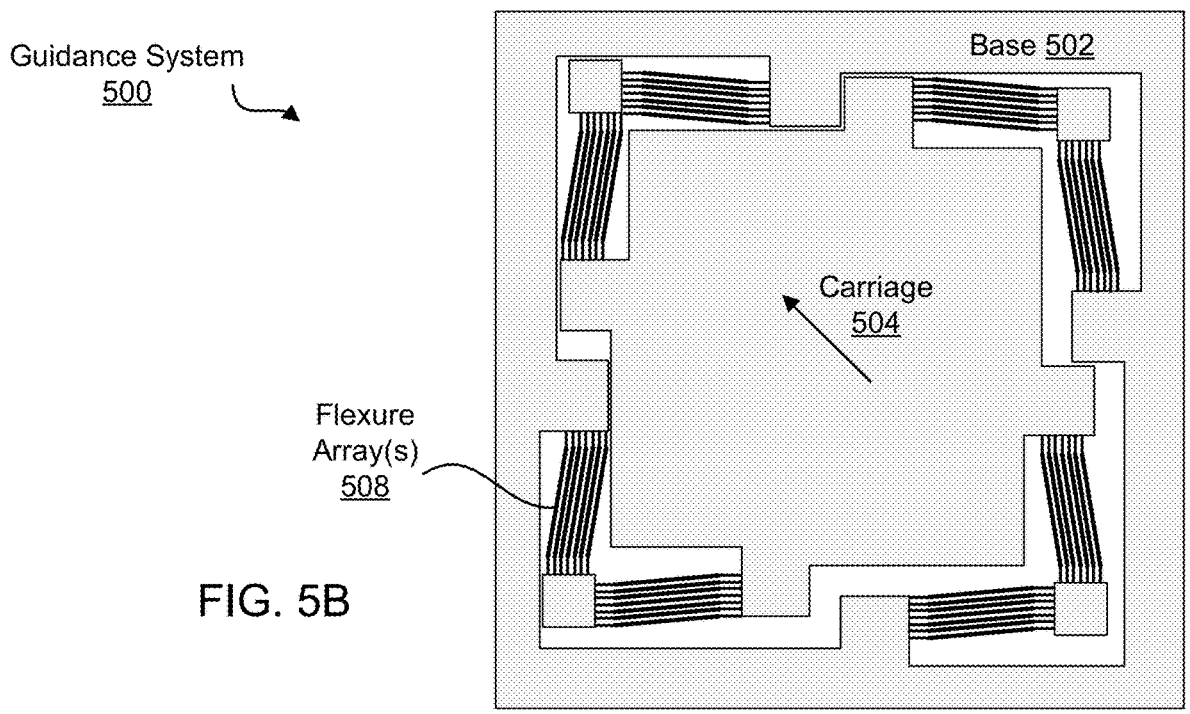
FIG. 5B shows a diagram of the XY stage of FIG. 5A in a second position, in accordance with at least one embodiment.

FIG. 5B shows the XY stage guidance system 500 of FIG. 5A in a second position, in accordance with at least one embodiment. In FIG. 5B, the power generating/force transmission element has caused the carriage 502 to diagonally move relative to the base 504, thereby, causing each flexure array 508 to bend/flex and guide motion of the carriage 502 relative to the base 502. Thus, in contrast to the linear stages of FIGS. 1-4 that provided movement in one direction (i.e., along the z-axis), the XY stage guidance system 500 provides movement in two directions (i.e., along a combination of X and Y directions). Guidance system 500, however, does not provide much rotational stiffness about Z. This stiffness would have to come from actuation. Moreover, actuation of individual axis would have to be robust to the transverse motion of the cross-axis, either by pivoting or translating.

Figure 6A:
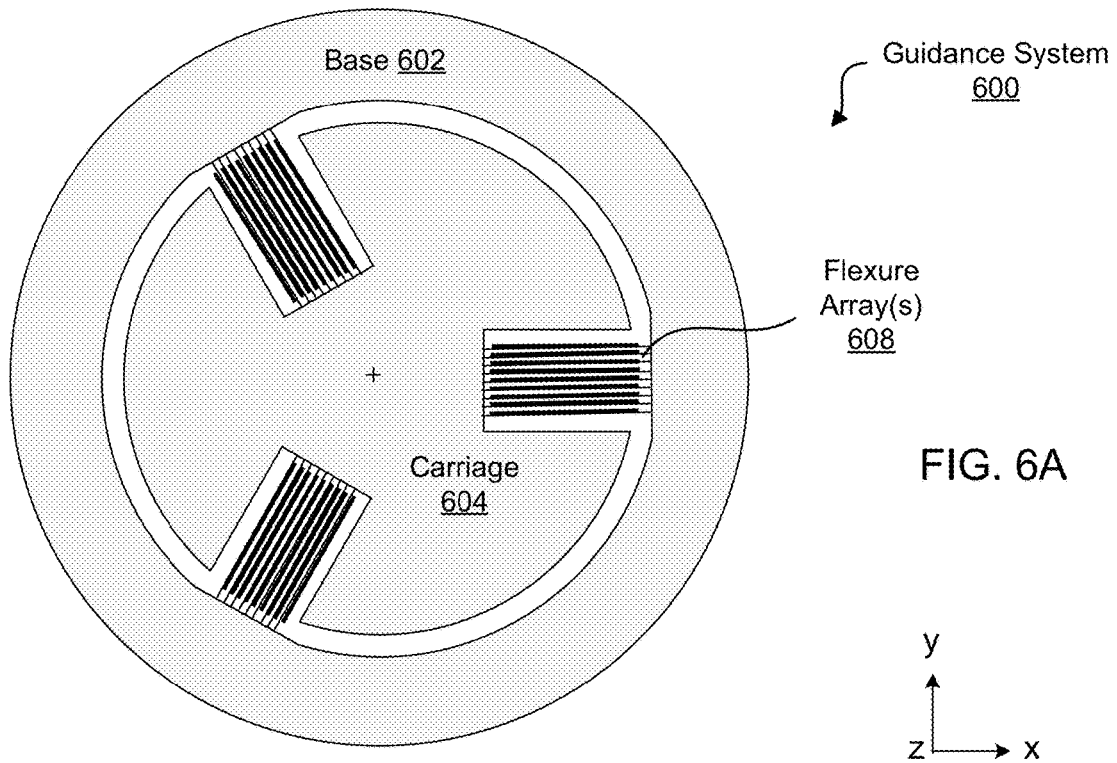
FIG. 6A shows a diagram of a rotary stage in a first position, in accordance with at least one embodiment.
Figure 6B:
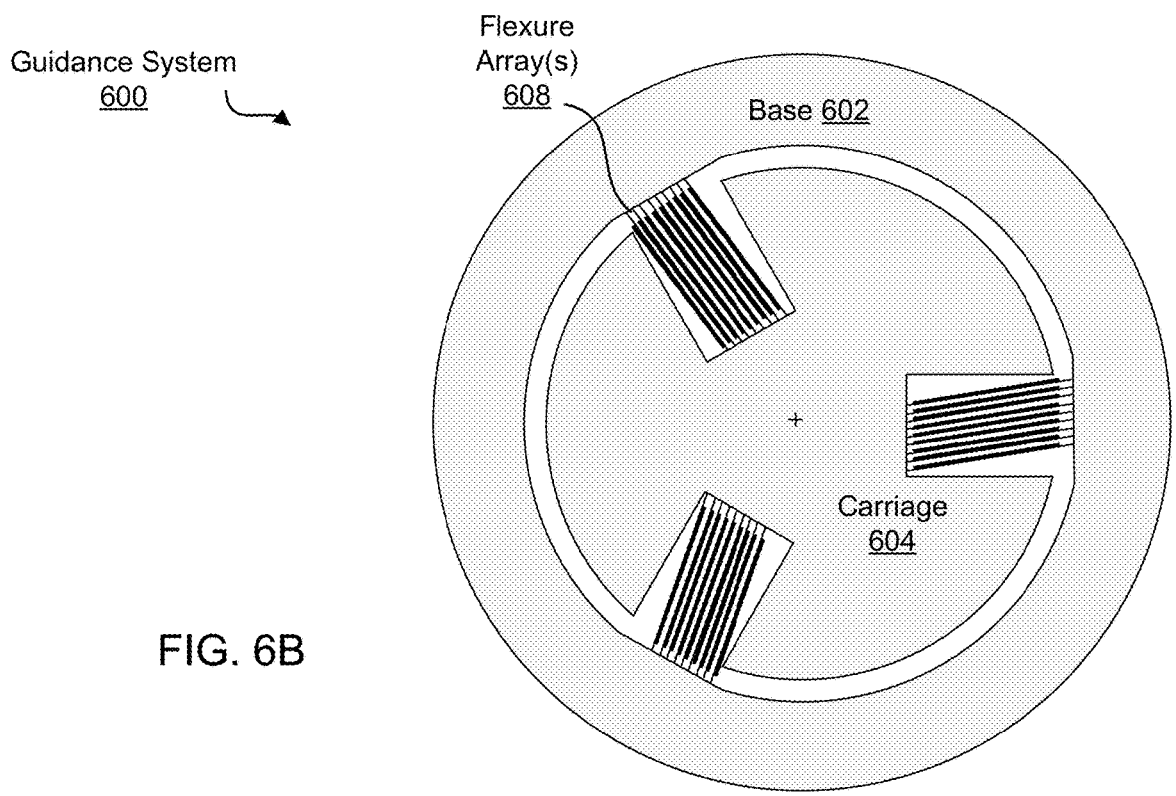
FIG. 6B shows a diagram of the rotary stage of FIG. 6A in a second position, in accordance with at least one embodiment.

Flexures inherently follow an arc motion that can be designed into a finite travel precision rotary stage. FIG. 6A shows a rotary stage guidance system 600 in a first position, in accordance with at least one embodiment. The rotary stage guidance system 600 includes a base 602, a carriage 604, flexure arrays 608 connecting the base 602 and carriage 604, a power generating/force transmission element, such as an actuator, motor, as discussed above (not shown), and, in some embodiments, a position sensor. As above, in this embodiment, flexure arrays 608 include stiffeners. Flexures inherently follow an arc motion that can be designed into a finite travel precision rotary stage. While FIGS. 6A-B show three groups of flexure arrays 608, the number of flexure arrays 608 can be anywhere from 2 or more (e.g., 2-10, depending on size and so forth). This configuration can also include the compounded leaf flexure array or leaf hinge flexure array as guidance. The rotary stage guidance system 600 eliminates arc motion but can help reduce stiffness and potential over-constraint. FIG. 6B shows a diagram of the rotary stage of FIG. 6A in a second position with the flexure arrays 608 bent/flexed, in accordance with at least one embodiment.

Flexure Guidance in a Head Mounted Display (HMD)

Figure 7:
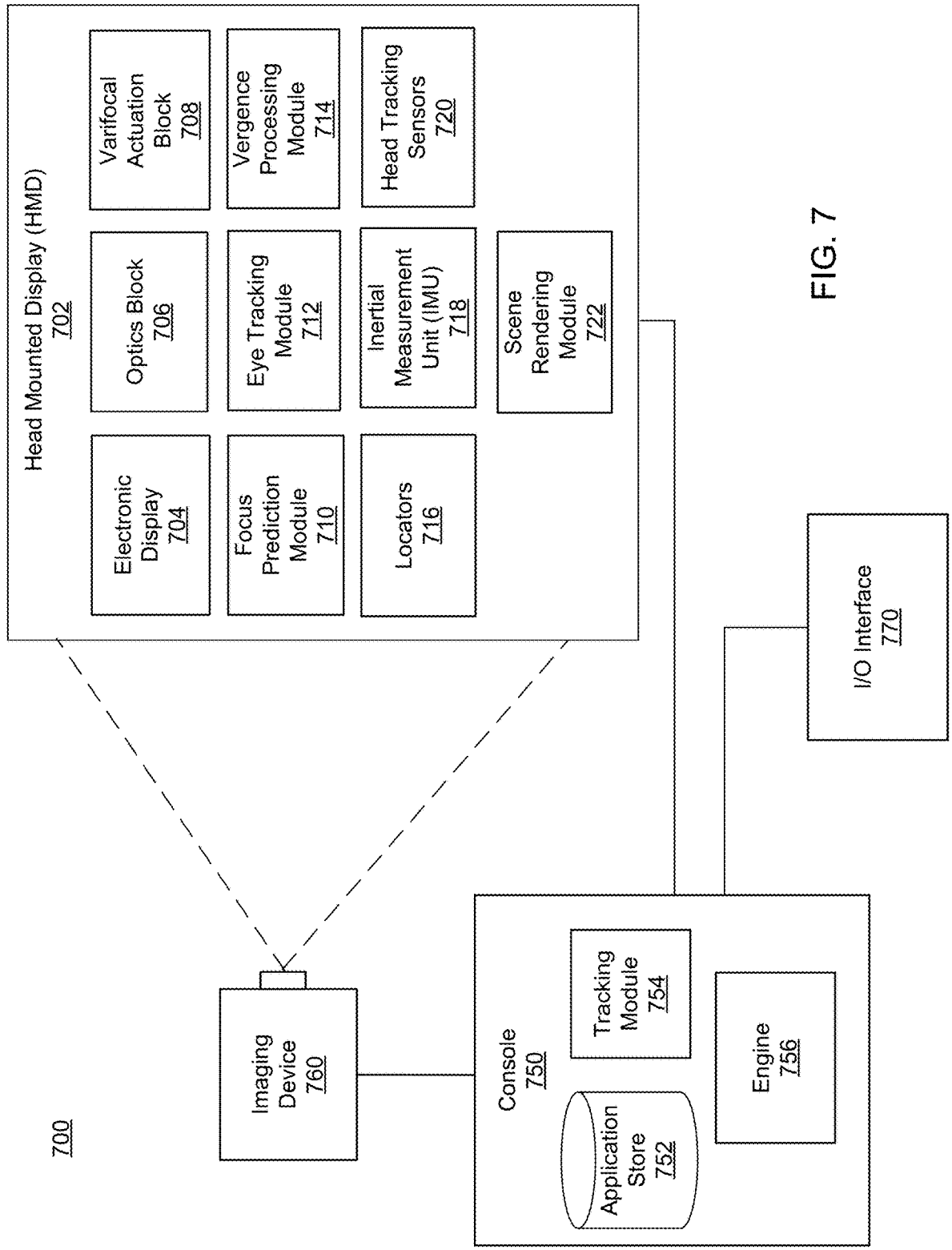
FIG. 7 shows an example virtual reality system, in accordance with at least one embodiment.

A HMD, such as described in FIG. 7, (or a near-eye display) may use a flexure based guidance system to dynamically adjust a location of an image plane (e.g., to address vergence-accommodation conflict). The guidance system can adjust a location of one or moveable elements (e.g., electronic display 704 and/or one or more optical elements) of optics block 704 to control a location of an image plane. As used herein, a moveable element is an element whose movement corresponds to a change in location of the image plane. For example, in the case of a pancake lens assembly, the guidance system may be configured to move one or all of the optical elements of the pancake lens and/or the electronic display 704 to change the location of the image plane.

The guidance system includes at least one actuator (e.g., a voice coil actuator, stepper motor, brushless DC electric motor, etc.) and a plurality of flexure elements that can flex and/or bend with movement of the actuator to adjust an on-axis location of at least one moveable element. In addition to the flexure elements described above, the flexure elements can include, for example, a parallel beam flexure system, a Roberts or dual Roberts, diaphragm flexure, a straight-line linkage based guidance with a flexure based pivoting element, a wire based flexure, a beam array, or some combination thereof.

Additional Flexure Guidance Considerations

In some embodiments, the guidance system is designed to have what is referred to as "infinite life," or the property whereby the flexures of the guidance system operate below a strain or fatigue threshold of the material, above which the performance of the material of flexure begins to degrade over time with use.

The guidance systems have a small form factor in order to facilitate use with a HMD and/or a near-eye display. For example, the flexure elements may be curved or arched to further decrease the form factor of the guidance system and, as a result, the HMD. And in some embodiments, the flexure elements may be plastic that is formed (e.g., injected molded) to further decrease form factor. One improvement in form factor is a decrease in a width of the flexures. Decreasing the width of the flexures can proportionally decrease on-axis stiffness further but can result in a significant decrease in off-axis stiffness (proportional to b3). To counter this loss of off-axis stiffness, an additional flexure pairs can be added (e.g., from 4 to 20 flexures) to form a beam array. The result is a more compact flexure guidance system with truer motion and minimal power requirements.

Flexure based guidance systems introduce very low amounts of tip/tilt (e.g., may be as low as 0.001 degree) during on-axis movement relative to conventional systems. Moreover, the guidance systems offer a high fidelity of control over movement of the one or more moveable elements. This is important for optical systems, such as the pancake lens assembly, where a small amount of movement of a single optical element can correspond to a relatively large change in the image plane location. Accordingly, such guidance systems also offer a friction free system that provides smooth, continuous motion, with predictable (e.g., deterministic, repeatability, etc.) motion behavior, that if not designed to fully cancel out off-axis translation, can still be calibrated out due to the repeatable and deterministic nature of the motion. For example, some of the guidance systems introduce some off-axis translational displacement (e.g., in x and/or y) in the moveable element (e.g., the display) as it displaces the moveable element on-axis (e.g., along z-axis). One advantage of the guidance systems is that the translational off-axis displacement is deterministic (i.e., it occurs in a repeatable, consistent manner such that it can be calibrated out of the system). In some embodiments, the electronic display 704 is calibrated to emit light in manner that offsets error introduced by the off-axis translational displacement of the moveable element. Moreover, the compound configurations may also be used to mitigate translational movement using additional sets of flexure elements.

Additionally, since some actuators do not have passive position holding (i.e., no power), the flexure based guidance system may include a power-down, position hold or lock given that the flexure systems are spring biased toward a rested position where the flexures are in an unbent state. For example, the flexure based guidance system may include a mechanism, such as a disengaging pin, swing over paddle, or other motion blocking mechanism, that effectively locks the electronic display 704 in place when the HMD 702 is powered down and that unlocks the electronic display 704 when the HMD 702 is powered up. The motion blocking mechanism may be actuated using a small stepper and leadscrew, bi-stable solenoid, nitinol wire, and so forth.

Moreover, a flexure based guidance system can be designed to mitigate additional loading conditions that can result from orientation changes with respect to gravity and from user head whips, for example. In some embodiments, the guidance systems may additionally include dampeners to mitigate overshoot caused by rapid and/or sudden adjustments in the moveable element.

System Overview

FIG. 7 shows varifocal system 700 using flexure based guidance system in which a head-mounted display (HMD) 702 operates. Varifocal system 700 may be for use as a virtual reality (VR) system, an augmented reality (AR) system, a mixed reality (MR) system, or some combination thereof. In this example, the varifocal system 700 includes HMD 702, imaging device 760, and I/O interface 770, which are each coupled to console 750. While FIG. 7 shows a single HMD 702, a single imaging device 760, and a single I/O interface 770, in other embodiments, any number of these components may be included in the system. For example, there may be multiple HMDs each having an associated I/O interface 770 and being monitored by one or more imaging devices 760, with each HMD 702, I/O interface 770, and imaging devices 760 communicating with the console 750. In alternative configurations, different and/or additional components may also be included in the system environment.

HMD 702 presents content to a user. Example content includes images, video, audio, or some combination thereof. Audio content may be presented via a separate device (e.g., speakers and/or headphones) external to HMD 702 that receives audio information from HMD 702, console 750, or both. HMD 702 includes electronic display 704, optics block 706, varifocal actuation block 708, focus prediction module 710, eye tracking module 712, vergence processing module 714, one or more locators 716, inertial measurement unit (IMU) 718, head tracking sensors 720, and scene rendering module 722.

Optics block 706 directs light from electronic display 704 to an exit pupil for viewing by a user using one or more optical elements, such as apertures, Fresnel lenses, convex lenses, concave lenses, filters, and so forth, and may include combinations of different optical elements. In some embodiments, one or more optical elements in optics block 706 may have one or more coatings, such as anti-reflective coatings. Magnification of the image light by optics block 706 allows electronic display 704 to be physically smaller, weigh less, and consume less power than larger displays. Additionally, magnification of the image light may increase a field of view of the displayed content. For example, the field of view of the displayed content is such that the displayed content is presented using almost all (e.g., 750 degrees diagonal), and in some cases, all, of the user's field of view. The optics block 706 can be a single lens or a system of lenses, such as a pancake lens. Additional detail regarding a pancake lens assembly is describe in detail in U.S. application Ser. Nos. 15/993,316, and 15/292,810, which are hereby incorporated by reference in their entirety.

Optics block 706 may be designed to correct one or more optical errors. Examples of optical errors include: barrel distortion, pincushion distortion, longitudinal chromatic aberration, transverse chromatic aberration, spherical aberration, chromatic aberration, field curvature, astigmatism, and so forth. In some embodiments, content provided to electronic display 704 for display is pre-distorted, and optics block 706 corrects the distortion when it receives image light from electronic display 704 generated based on the content.

Varifocal actuation block 708 includes a varifocal actuation block that causes optics block 706 to vary the focal distance of HMD 702 to keep a user's eyes in a zone of comfort as vergence and accommodation change. In one embodiment, varifocal actuation block 708 physically changes the distance between electronic display 704 and optical block 706 by moving electronic display 704 or optical block 706 (or both). Additionally, moving or translating two lenses relative to each other may also be used to change the focal distance of HMD 702. Thus, varifocal actuation block 708 may include actuators or motors that move electronic display 704 and/or optical block 706 to change the distance between them. Varifocal actuation block 708 may be separate from or integrated into optics block 706 in various embodiments.

Each state of optics block 706 corresponds to a focal distance of HMD 702 or to a combination of the focal distance and eye position relative to optics block 706 (as discussed further below). In operation, optics block 706 may move in a range of ~5-10 mm with a positional accuracy of ~5-10 µm for a granularity of around 1000 focal distances, corresponding to 1000 states of optics block 706. Any number of states could be provided; however, a limited number of states accommodate the sensitivity of the human eye, allowing some embodiments to include fewer focal distances. For example, a first state corresponds to a focal distance of a theoretical infinity meters (0 diopter), a second state corresponds to a focal distance of 2.0 meters (0.5 diopter), a third state corresponds to a focal distance of 1.0 meters (1 diopter), a fourth state corresponds to a focal distance of 0.5 meters (1 diopter), a fifth state corresponds to a focal distance of 0.333 meters (3 diopter), and a sixth state corresponds to a focal distance of 0.250 meters (4 diopter). Varifocal actuation block 708, thus, sets and changes the state of optics block 706 to achieve a desired focal distance.

Focus prediction module 710 is an encoder including logic that tracks the position or state of optics block 706 to predict to one or more future states or locations of optics block 706. For example, focus prediction module 710 accumulates historical information corresponding to previous states of optics block 706 and predicts a future state of optics block 706 based on the previous states. Because rendering of a virtual scene by HMD 702 is adjusted based on the state of optics block 706, the predicted state allows scene rendering module 722, further described below, to determine an adjustment to apply to the virtual scene for a particular frame. Accordingly, focus prediction module 710 communicates information describing a predicted state of optics block 706 for a frame to scene rendering module 722. Adjustments for the different states of optics block 706 performed by scene rendering module 722 are further described below.

Eye tracking module 712 tracks an eye position and eye movement of a user of HMD 702. A camera or other optical sensor inside HMD 702 captures image information of a user's eyes, and eye tracking module 712 uses the captured information to determine interpupillary distance, interocular distance, a three-dimensional (3D) position of each eye relative to HMD 702 (e.g., for distortion adjustment purposes), including a magnitude of torsion and rotation (i.e., roll, pitch, and yaw) and gaze directions for each eye. In one example, infrared light is emitted within HMD 702 and reflected from each eye. The reflected light is received or detected by the camera and analyzed to extract eye rotation from changes in the infrared light reflected by each eye. Many methods for tracking the eyes of a user can be used by eye tracking module 712. Accordingly, eye tracking module 712 may track up to six degrees of freedom of each eye (i.e., 3D position, roll, pitch, and yaw) and at least a subset of the tracked quantities may be combined from two eyes of a user to estimate a gaze point (i.e., a 3D location or position in the virtual scene where the user is looking). For example, eye tracking module 712 integrates information from past measurements, measurements identifying a position of a user's head, and 3D information describing a scene presented by electronic display element 704. Thus, information for the position and orientation of the user's eyes is used to determine the gaze point in a virtual scene presented by HMD 702 where the user is looking.

Further, distance between a pupil and optics block 706 changes as the eye moves to look in different directions. The varying distance between pupil and optics block 706 as viewing direction changes is referred to as "pupil swim" and contributes to distortion perceived by the user as a result of light focusing in different locations as the distance between pupil and optics block 706. Accordingly, measuring distortion at different eye positions and pupil distances relative to optics block 706 and generating distortion corrections for different positions and distances allows mitigation of distortion caused by "pupil swim" by tracking the 3D position of a user's eyes and applying a distortion correction corresponding to the 3D position of each of the user's eye at a given point in time. Thus, knowing the 3D position of each of a user's eyes allows for the mitigation of distortion caused by changes in the distance between the pupil of the eye and optics block 706 by applying a distortion correction for each 3D eye position.

Vergence processing module 714 determines a vergence depth of a user's gaze based on the gaze point or an estimated intersection of the gaze lines determined by eye tracking module 712. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, vergence processing module 714 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused and a depth from the user's eyes at which the eyes are focused, thereby, providing information, such as an object or plane of focus, for rendering adjustments to the virtual scene.

In some embodiments, rather than provide accommodation for the eye at a determined vergence depth, accommodation may be directly determined by a wavefront sensor, such as a Shack-Hartmann wavefront sensor; hence, a state of optics block 706 may be a function of the vergence or accommodation depth and the 3D position of each eye, so optics block 706 brings objects in a scene presented by electronic display element 704 into focus for a user viewing the scene. Further, vergence and accommodation information may be combined to focus optics block 706 and to render synthetic depth of field blur.

Locators 716 are objects located in specific positions on HMD 702 relative to one another and relative to a specific reference point on HMD 702. Locator 716 may be a light emitting diode (LED), a corner cube reflector, a reflective marker, a type of light source that contrasts with an environment in which HMD 702 operates, or some combination thereof. Active locators 716 (i.e., an LED or other type of light emitting device) may emit light in the visible band (~380 nm to 750 nm), in the infrared (IR) band (~750 nm to 1 mm), in the ultraviolet band (10 nm to 380 nm), some other portion of the electromagnetic spectrum, or some combination thereof.

Locators 716 can be located beneath an outer surface of HMD 702, which is transparent to the wavelengths of light emitted or reflected by locators 716 or is thin enough not to substantially attenuate the wavelengths of light emitted or reflected by locators 716. Further, the outer surface or other portions of HMD 702 can be opaque in the visible band of wavelengths of light. Thus, locators 716 may emit light in the IR band while under an outer surface of HMD 702 that is transparent in the IR band but opaque in the visible band.

IMU 718 is an electronic device that generates fast calibration data based on measurement signals received from one or more of head tracking sensors 720, which generate one or more measurement signals in response to motion of HMD 702. Examples of head tracking sensors 720 include accelerometers, gyroscopes, magnetometers, other sensors suitable for detecting motion, correcting error associated with IMU 718, or some combination thereof. Head tracking sensors 720 may be located external to IMU 718, internal to IMU 718, or some combination thereof.

Based on the measurement signals from head tracking sensors 720, IMU 718 generates fast calibration data indicating an estimated position of HMD 702 relative to an initial position of HMD 702. For example, head tracking sensors 720 include multiple accelerometers to measure translational motion (forward/back, up/down, left/right) and multiple gyroscopes to measure rotational motion (e.g., pitch, yaw, and roll). IMU 718 can, for example, rapidly sample the measurement signals and calculate the estimated position of HMD 702 from the sampled data. For example, IMU 718 integrates measurement signals received from the accelerometers over time to estimate a velocity vector and integrates the velocity vector over time to determine an estimated position of a reference point on HMD 702. The reference point is a point that may be used to describe the position of HMD 702. While the reference point may generally be defined as a point in space, in various embodiments, reference point is defined as a point within HMD 702 (e.g., a center of the IMU 718). Alternatively, IMU 718 provides the sampled measurement signals to console 750, which determines the fast calibration data.

IMU 718 can additionally receive one or more calibration parameters from console 750. As further discussed below, the one or more calibration parameters are used to maintain tracking of HMD 702. Based on a received calibration parameter, IMU 718 may adjust one or more IMU parameters (e.g., sample rate). In some embodiments, certain calibration parameters cause IMU 718 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

Scene render module 722 receives content for the virtual scene from engine 756 and provides the content for display on electronic display 704. Additionally, scene render module 722 can adjust the content based on information from focus prediction module 710, vergence processing module 714, IMU 718, and head tracking sensors 720. For example, upon receiving the content from engine 756, scene render module 722 adjusts the content based on the predicted state (i.e., eye position and focal distance) of optics block 706 received from focus prediction module 710 by adding a correction or pre-distortion into rendering of the virtual scene to compensate or correct for the distortion caused by the predicted state of optics block 706. Scene render module 722 may also add depth of field blur based on the user's gaze, vergence depth (or accommodation depth) received from vergence processing module 714, or measured properties of the user's eye (e.g., 3D position of the eye, etc.). Additionally, scene render module 722 determines a portion of the content to be displayed on electronic display 704 based on one or more of tracking module 754, head tracking sensors 720, or IMU 718, as described further below.

Imaging device 760 generates slow calibration data in accordance with calibration parameters received from console 750. Slow calibration data includes one or more images showing observed positions of locators 716 that are detectable by imaging device 760. Imaging device 760 may include one or more cameras, one or more video cameras, other devices capable of capturing images including one or more locators 716, or some combination thereof. Additionally, imaging device 760 may include one or more filters (e.g., for increasing signal to noise ratio). Imaging device 760 is configured to detect light emitted or reflected from locators 716 in a field of view of imaging device 760. In embodiments where locators 716 include passive elements (e.g., a retroreflector), imaging device 760 may include a light source that illuminates some or all of locators 716, which retro-reflect the light towards the light source in imaging device 760. Slow calibration data is communicated from imaging device 760 to console 750, and imaging device 760 receives one or more calibration parameters from console 750 to adjust one or more imaging parameters (e.g., focal distance, focus, frame rate, ISO, sensor temperature, shutter speed, aperture, etc.).

I/O interface 770 is a device that allows a user to send action requests to console 750. An action request is a request to perform a particular action. For example, an action request may be to start or end an application or to perform a particular action within the application. I/O interface 770 may include one or more input devices. Example input devices include a keyboard, a mouse, a game controller, or any other suitable device for receiving action requests and communicating the received action requests to console 750. An action request received by I/O interface 770 is communicated to console 750, which performs an action corresponding to the action request. In some embodiments, I/O interface 770 may provide haptic feedback to the user in accordance with instructions received from console 750. For example, haptic feedback is provided by the I/O interface 770 when an action request is received, or console 750 communicates instructions to I/O interface 770 causing I/O interface 770 to generate haptic feedback when console 750 performs an action.

Console 750 provides content to HMD 702 for presentation to the user in accordance with information received from imaging device 760, HMD 702, or I/O interface 770. In the example shown in FIG. 7, console 750 includes application store 752, tracking module 754, and engine 756. Some embodiments of console 750 have different or additional modules than those described in conjunction with FIG. 7. Similarly, the functions further described below may be distributed among components of console 750 in a different manner than is described here.

Application store 752 stores one or more applications for execution by console 750. An application is a group of instructions, that when executed by a processor, generates content for presentation to the user. Content generated by an application may be in response to inputs received from the user via movement of HMD 702 or interface device 770. Examples of applications include gaming applications, conferencing applications, video playback application, or other suitable applications.

Tracking module 754 calibrates system 700 using one or more calibration parameters and may adjust one or more calibration parameters to reduce error in determining position of HMD 702. For example, tracking module 754 adjusts the focus of imaging device 760 to obtain a more accurate position for observed locators 716 on HMD 702. Moreover, calibration performed by tracking module 754 also accounts for information received from IMU 718. Additionally, if tracking of HMD 702 is lost (e.g., imaging device 760 loses line of sight of at least a threshold number of locators 716), tracking module 754 re-calibrates some or all of the system components.

Additionally, tracking module 754 tracks the movement of HMD 702 using slow calibration information from imaging device 760 and determines positions of a reference point on HMD 702 using observed locators from the slow calibration information and a model of HMD 702. Tracking module 754 also determines positions of the reference point on HMD 702 using position information from the fast calibration information from IMU 718 on HMD 702. Additionally, tracking module 754 may use portions of the fast calibration information, the slow calibration information, or some combination thereof, to predict a future location of HMD 702, which is provided to engine 756.

Engine 756 executes applications within the system and receives position information, acceleration information, velocity information, predicted future positions, or some combination thereof for HMD 702 from tracking module 754. Based on the received information, engine 756 determines content to provide to HMD 702 for presentation to the user, such as a virtual scene. For example, if the received information indicates that the user has looked to the left, engine 756 generates content for HMD 702 that mirrors or tracks the user's movement in a virtual environment. Additionally, engine 756 performs an action within an application executing on console 750 in response to an action request received from the I/O interface 770 and provides feedback to the user that the action was performed. The provided feedback may be visual or audible feedback via HMD 702 or haptic feedback via I/O interface 770.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A guidance system comprising:
   a carriage configured to move relative to a base;
   an actuator connecting the base and the carriage, the actuator configured to move the carriage relative to the base along an axis of motion; and
   at least two sets of flexure arrays connecting the base to the carriage,
   wherein the actuator moves the carriage along the axis of motion causing each of the at least two sets of flexure arrays to flex guiding movement of the carriage along the axis of motion while reducing off-axis translational displacement of the carriage in one or more axes that are each orthogonal to the axis of motion, each flexure array comprising a plurality of leaf flexure elements with each leaf flexure element being between 0.0005" and 0.0050" thick.

2. The guidance system of claim 1, wherein a first flexure array of the at least two sets of flexure arrays connects the carriage to the base at a first end of the carriage and the base, and wherein a second flexure array of the at least two sets of flexure arrays connects the carriage to the base at a second end of the carriage and the base.

3. The guidance system of claim 1, wherein each of the at least two sets of flexure arrays comprises three or more leaf flexure elements.

4. The guidance system of claim 1, wherein the guidance system is adapted for use with a head mounted display.

5. The guidance system of claim 1, wherein each leaf flexure element includes a stiffener comprising an additional layer of material on a middle portion of the leaf flexure element that is not on end portions of the leaf flexure element, the stiffener configured to reduce bending in the middle portion of the leaf flexure element.

6. The guidance system of claim 5, wherein the stiffener of each leaf flexure element focuses flexing of the leaf flexure element to each end of the leaf flexure element corresponding to an area along a length of the leaf flexure element other than where the stiffener is located.

7. The guidance system of claim 1, wherein the guidance system is adapted to adjust a location of one or more moveable elements whose movement corresponds to a change in location of an image plane of a head mounted display.

8. The guidance system of claim 1, further comprising a sensor to sense a state of the carriage relative to the base.

* * * * *